United States Patent
Murakami

(10) Patent No.: US 7,521,795 B2
(45) Date of Patent: Apr. 21, 2009

(54) SEMICONDUCTOR PACKAGE

(75) Inventor: Yoshinori Murakami, Tokyo (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 206 days.

(21) Appl. No.: 11/189,886

(22) Filed: Jul. 27, 2005

(65) Prior Publication Data
US 2006/0022307 A1  Feb. 2, 2006

(30) Foreign Application Priority Data
Jul. 29, 2004  (JP) ............... P2004-221706

(51) Int. Cl.
*H01L 23/04* (2006.01)
(52) U.S. Cl. ............ 257/730; 257/700; 438/125
(58) Field of Classification Search ......... 257/688, 257/700, 730
See application file for complete search history.

(56) References Cited

U.S. PATENT DOCUMENTS

| | | | | |
|---|---|---|---|---|
| 3,831,066 A | * | 8/1974 | Gabrail ............ | 257/710 |
| 6,160,218 A | * | 12/2000 | Azdasht et al. ....... | 174/549 |
| 6,911,727 B1 | * | 6/2005 | Martin et al. ......... | 257/704 |
| 2004/0169289 A1 | * | 9/2004 | Satou et al. .......... | 257/780 |

* cited by examiner

*Primary Examiner*—Thao X Le
*Assistant Examiner*—Ajay K Arora
(74) *Attorney, Agent, or Firm*—McDermott Will & Emery LLP

(57) ABSTRACT

A semiconductor package has: a semiconductor chip having first and second main electrodes arranged on two principal surfaces being opposite to each other; a first main wiring plate connected to the first main electrode and having a first external connection terminal; a second main wiring plate connected to the second main electrode and having a second external connection terminal; a first shell connected through an insulating film to at least a part of a second principal surface of the first main wiring plate, the second principal surface of the first main wiring plate being opposite to a first principal surface of the first main wiring plate that is connected to the first electrode; and a second shell connected through an insulating film to at least a part of a second principal surface of the second main wiring plate, the second principal surface of the second main wiring plate being opposite to a first principal surface of the second main wiring plate that is connected to the second electrode. The first principal surfaces of the first and second main wiring plates are adjacent to and parallel to each other except at the locations where the first and second main wiring plates are connected to the semiconductor chip and the locations where the first and second external connection terminals are formed.

9 Claims, 10 Drawing Sheets

SEMICONDUCTOR PACKAGE

BACKGROUND OF THE INVENTION

The present invention relates to semiconductor packages such as power semiconductor packages.

A power semiconductor package according to a related art has a massive metal plate, an insulating plate fixed to a principal surface of the metal plate, anode and cathode wiring formed on the insulating plate, and a semiconductor chip. The semiconductor chip has a cathode electrode and an anode electrode on the top and bottom surfaces thereof, respectively. The anode electrode is face-bonded to the anode wiring and is electrically connected thereto. The cathode electrode is electrically connected to the cathode wiring via a metal wire. Except the bottom surface of the metal plate, the above-mentioned elements are covered with a plastic shell. The anode wiring and cathode wiring are partly exposed from the shell to the outside, to serve as terminals. In this power semiconductor package, the exposed bottom surface of the metal plate is thermally connected to an external cooler to cool the semiconductor chip that generates heat.

SUMMARY OF THE INVENTION

In the power semiconductor package mentioned above, the bottom side, i.e., the anode side of the semiconductor chip is properly cooled by the high thermal conductivity of the insulating plate arranged between the semiconductor chip and the metal plate. The top side, i.e., the cathode side of the semiconductor chip, however, is insufficiently cooled because of bonding wires that connect the semiconductor chip to wiring on the insulating plate. The bonding wires occupy a certain space in the package and thereby limits a minimum volume of the package. Each face of the semiconductor chip is in contact with a material having a different thermal expansion coefficient, and therefore, the semiconductor chip has a risk of receiving excessive stress due to temperature variation. To avoid the risk, the metal plate must secure a sufficient degree of rigidity. Namely, the metal plate must be thick, and this limits a beat radiation capability.

In such circumstances, an object of the present invention is to provide a semiconductor package that is compact and achieves satisfactory heat radiation.

DETAILED DESCRIPTION OF THE EMBODIMENTS

First Embodiment

Figure 1:
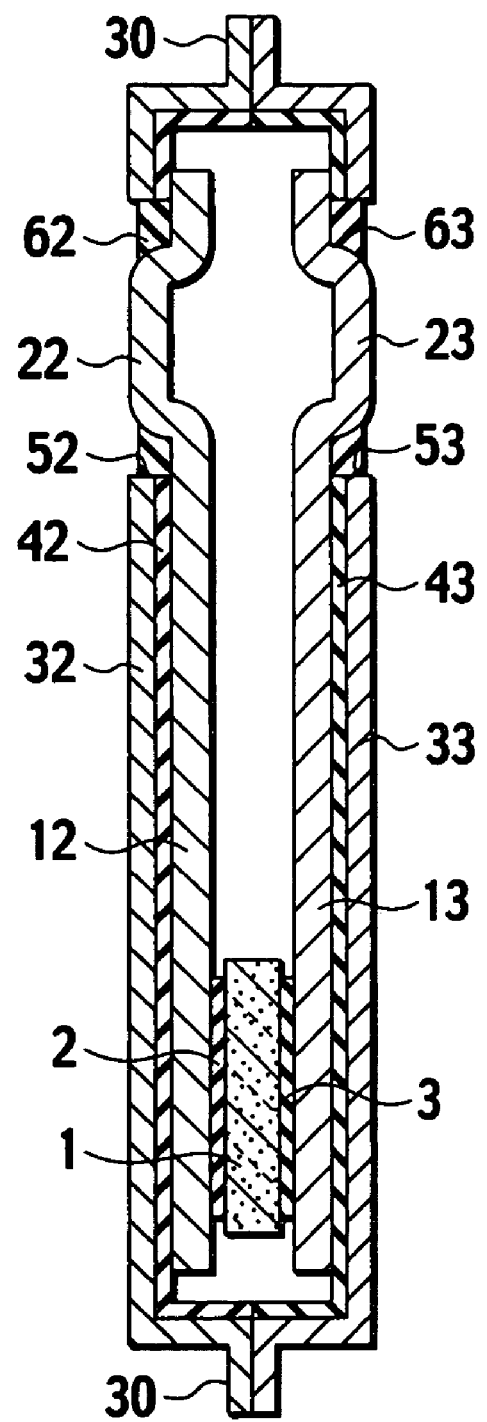
FIG. 1 is a sectional view showing a semiconductor package according to a first embodiment of the present invention.
Figure 2:
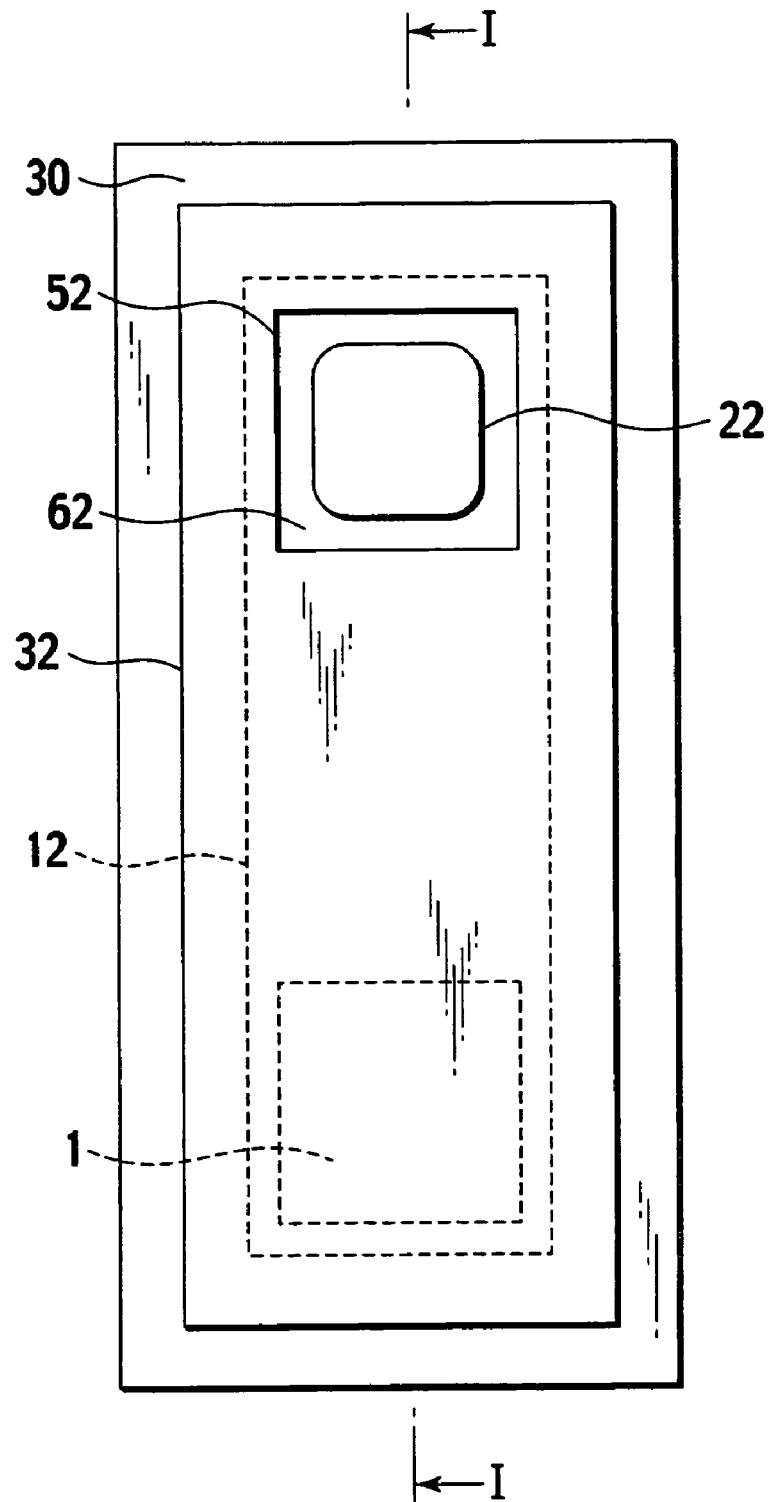
FIG. 2 is a plan view showing the semiconductor package of FIG. 1.

With reference to FIGS. 1 and 2, a semiconductor package according to a first embodiment of the present invention will be explained. FIG. 1 is a sectional view showing the semiconductor package, and FIG. 2 is a plan view showing the top of the semiconductor package of FIG. 1. The sectional view of FIG. 1 corresponds to a line I-I of FIG. 2.

Components of the semiconductor package will be explained. A semiconductor chip 1 has first and second principal surfaces that are opposite to each other. The first principal surface has a cathode electrode 2 serving as a first main electrode, and the second principal surface has an anode electrode 3 serving as a second main electrode. The cathode electrode 2 is in face-to-face contact with cathode wiring 12 serving as a first main wiring plate. Due to the face-to-face contact, connection between the cathode electrode 2 and the cathode wiring 12 is low in electric resistance as well as in thermal resistance. The anode electrode 3 is in face-to-face contact with anode wiring 13 serving as a second main wiring plate. Due to the face-to-face contact, connection between the anode electrode 3 and the anode wiring 13 is low in electric resistance as well as in thermal resistance. Opposite to the cathode electrode 2, the cathode wiring 12 is in face-to-face contact with a first shell 32 via an insulating film 42. The cathode wiring 12 is connected to the first shell 32 at least at one location at low thermal resistance. Opposite to the anode electrode 3, the anode wiring 13 is in face-to-face contact with a second shell 33 via an insulating film 43. The anode wiring 13 is connected to the second shell 33 at least at one location at low thermal resistance. The cathode wiring 12 has a first external connection terminal 22 whose location is different from the location where the cathode wiring 12 is connected to the cathode electrode 2. The anode wiring 13 has a second external connection terminal 23 whose location is different from the location where the anode wiring 13 is connected to the anode electrode 3.

In this embodiment, the semiconductor chip 1 is a diode chip of several tens to several hundreds of micrometers thick. A dotted line 1 in FIG. 2 indicates a location in the package where the semiconductor ship is present. In FIG. 1, the cathode electrode 2 is on the top surface of the semiconductor chip 1, and the anode electrode 3 is on the bottom surface thereof. The cathode wiring 12 and anode wiring 13 are each made of a thin metal plate of about 100 to 300 μm thick. A dotted line 12 in FIG. 2 indicates a location in the package where the cathode wiring 12 and anode wiring 13 are present. The cathode wiring 12 and anode wiring 13 are electrically connected to the cathode electrode 2 and anode electrode 3, respectively, by soldering (not shown) or the like. These two wirings are insulated from each other, and are located being parallel and close to each other to minimize inductance during the semiconductor chip 1 is operated and the cathode wiring 12 and anode wiring 13 conduct the same amount of current in opposite direction.

The first and second shells 32 and 33 are each made of a metal plate of several hundreds of micrometers thick. As shown in FIG. 1, the first and second shells 32 and 33 are entirely joined together along the peripheries 30 thereof without a gap between them. An interior side of the first shell 32 is provided with the insulating film 42, and an interior side of the second shell 33 is provided with the insulating film 43. The insulating films 42 and 43 have each a thickness of several to several tens of micrometers. The insulating films 42 and 43 are made of organic insulating material or inorganic insulating material such as alumina or silicon oxide formed by vapor deposition, aerosol deposition, printing, and the like. The thickness of the insulating films 42 and 43 is determined according to the withstand voltage of the insulating material or the withstand voltage of the semiconductor chip 1. The insulating films 42 and 43 may be made from insulating ceramic plates made by sintering. In this case, the thickness of the ceramic plates may be thinner than those used for related arts. Generally, the semiconductor chip 1 and ceramic plates are vulnerable to tensile stress caused by bending. The insulating films 42 and 43 of FIGS. 1 and 2, however, are connected to the opposite surfaces of the semiconductor chip 1 substantially in the same configuration, to realize symmetrical stress application to the opposite surfaces of the semiconductor chip 1. Accordingly, it is not necessary for the insulating films 42 and 43 to have rigidity, and therefore, they may be thinner than those of related arts.

According to the first embodiment, heat from the two principal surfaces of the semiconductor chip 1 is properly dissipated through connections to the electrodes 2 and 3, wiring plates 12 and 13, and shells 32 and 33. In addition, the package of the first embodiment is compact with a thickness of one to several millimeters compared with conventional packages of several centimeters in thickness.

Away from the semiconductor chip 1, the first shell 32 has a first hole 52 and the second shell 33 has a second hole 53. From the first hole 52, the first external connection terminal 22 of the cathode wiring 12 is exposed, and from the second hole 53, the second external connection terminal 23 of the anode wiring 13 is exposed. A gap between the first hole 52 and the first terminal 22 is filled with an insulator 62, and a gap between the second hole 53 and the second terminal 23 is filled with an insulator 63. Consequently, the inside of the integrated first and second shells 32 and 33, i.e., the inside of the package is airtight. The inside of the package may be filled with a proper insulator or an inert gas. When a gas is used to fill the inside of the package, it is preferable to maintain a negative pressure within the package. Heat generated by the semiconductor chip 1 expands the inside gas to increase the inner pressure of the package. If the inner pressure becomes positive, it gives stress to every connecting portion in pulling direction. It is preferable, therefore, that the inner pressure of the package is kept negative even when the atmospheric pressure is low and the inner temperature of the package increases to a rated temperature set for the package. For the use of the semiconductor package at high altitude, an atmospheric pressure of, for example, $5.1 \times 10^4$ Pa (0.5 atmospheres) is assumed, and an upper limit temperature of 150° C. is selected as a design value for the package. To keep the inner pressure of the package negative under these conditions, the package must have an inner pressure of $3.4 \times 10^4$ Pa (⅓ atmospheres) or lower at 0° C.

The package as a whole may be made flexible. In this case, the semiconductor chip 1 is formed with a thickness of several tens of micrometers to provide flexibility, and the cathode wiring 12, anode wiring 13, and first and second shells 32 and 33 are made from flexible materials. The flexible semiconductor package realizes a variety of mounting patterns. For example, it may be bent and attached to the periphery of a circular water pipe.

(First Modification)

Figure 3:
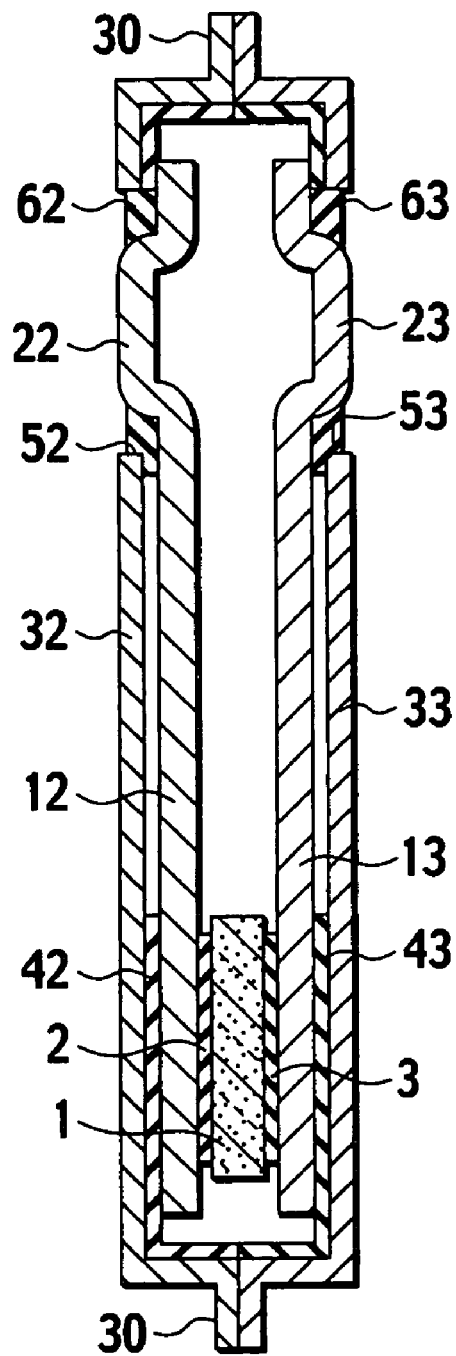
FIG. 3 is a sectional view showing a first modification of the semiconductor package of FIG. 1.

In FIG. 1, the cathode wiring 12 and anode wiring 13 are entirely in face-to-face contact with the insulating films 42 and 43, respectively. According to a first modification of the first embodiment shown in FIG. 3, the cathode wiring 12 (anode wiring 13) is connected to the insulating film 42 (43) at least at a part of the cathode wiring 12 (anode wiring 13) opposite to the location where the cathode wiring 12 (anode wiring 13) is connected to the semiconductor chip 1. To connect the wiring plates 12 and 13 to the insulating films 42 and 43, metal thin films are formed on the surfaces of the insulating films 42 and 43, and the wiring plates 12 and 13 are soldered to the metal thin films, respectively. As shown in FIG. 1, the insulating films 42 and 43 may be formed to entirely cover the inner faces of the first and second shells 32 and 33, and the metal films connected to the wiring plates 12 and 13 may be formed in limited areas adjacent to the semiconductor chip 1.

(Second Modification)

Figure 4:
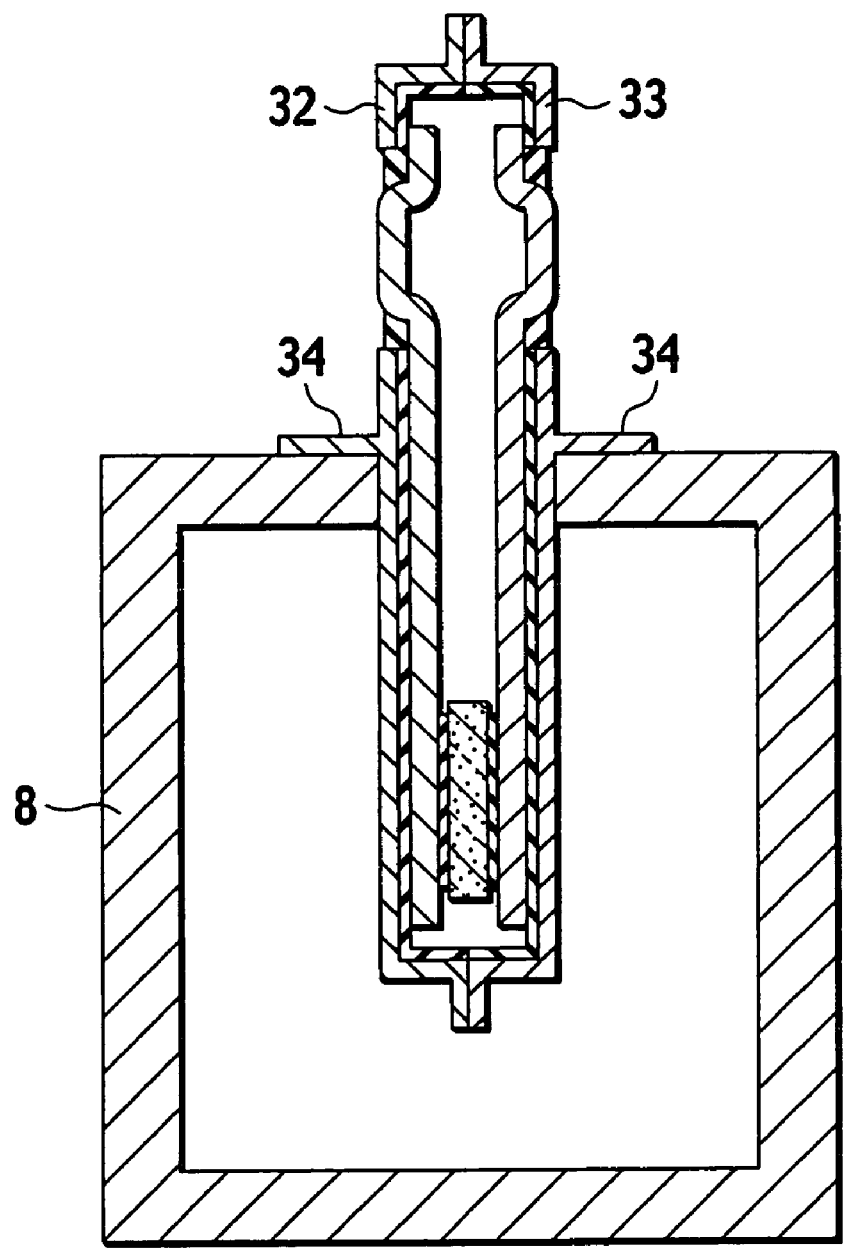
FIG. 4 is a sectional view explaining a second modification of the semiconductor package of FIG. 1.

FIG. 4 shows a second modification of the first embodiment. The second modification provides the semiconductor package of the first embodiment with a flange 34 on the first and second shells 32 and 33 and a water pipe 8 for conducting water. The flange 34 surrounds the shells 32 and 33. The flange 34 and water pipe 8 are joined together so that no water flowing through the water pipe 8 may leak outside. The semiconductor package of the second modification is thin and airtight and is uniformly cooled from both surfaces thereof. The semiconductor package is embedded in the water pipe 8 so that the package itself may serve as a heat radiation fin. The semiconductor package may be configured to be detachable from the water pipe 8.

(Third Modification)

Figure 5:
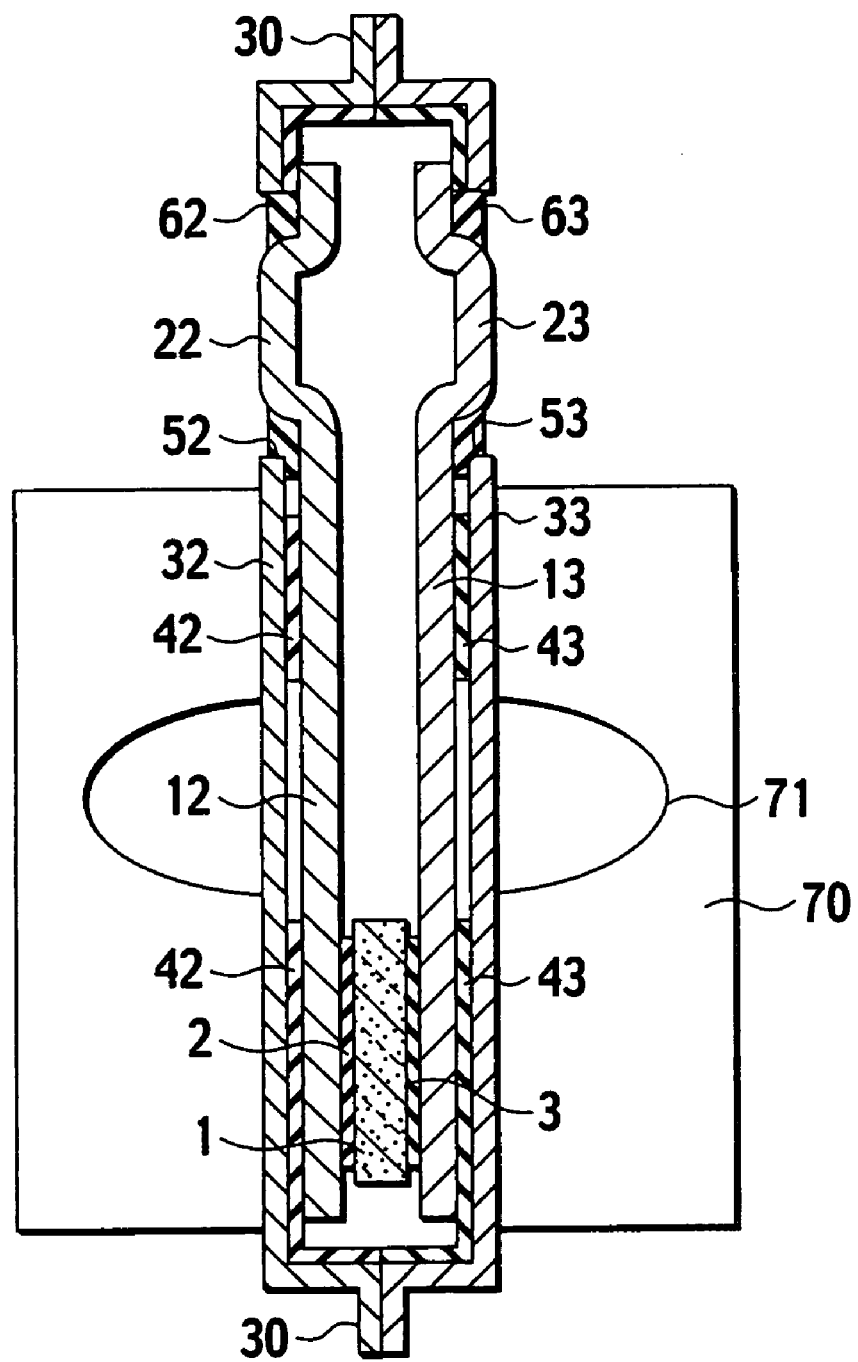
FIG. 5 is a sectional view explaining a third modification of the semiconductor package of FIG. 1.

FIG. 5 shows a third modification of the first embodiment. The third modification provides the semiconductor package of the first embodiment with heat radiation fins 70 that are attached to the outer faces of the first and second shells 32 and 33. In some cases, the first and second external connection terminals 22 and 23 are required not to be heated with heat generated by the semiconductor chip 1. The semiconductor chip 1 is connected to the terminals 22 and 23 through the cathode wiring 12 and anode wiring 13, and therefore, the cathode wiring 12 and anode wiring 13 must be cooled between the semiconductor chip 1 and the terminals 22 and 23. To achieve this, one side of each heat radiation fin 70 is connected to the first shell 32 or second shell 33 as shown in FIG. 5. In this case, the fin 70 is dominated by thermal conduction from the semiconductor chip 1. To avoid this, the fin 70 may have a slit 71 as shown in FIG. 5. Instead, each fin 70 may be divided into two parts, one on the semiconductor chip side and the other on the external connection terminal side. To prevent heat of the semiconductor chip 1 from being transmitted through the first and second shells 32 and 33 to the terminals 22 and 23, the insulating films 42 and 43 may be partly removed as shown in FIG. 5. For cooling not only the semiconductor chip 1 but also the terminals 22 and 23, the heat radiation fins 70 are connected only above the semiconductor chip 1 and near the terminals 22 and 23.

Second Embodiment

Figure 6:
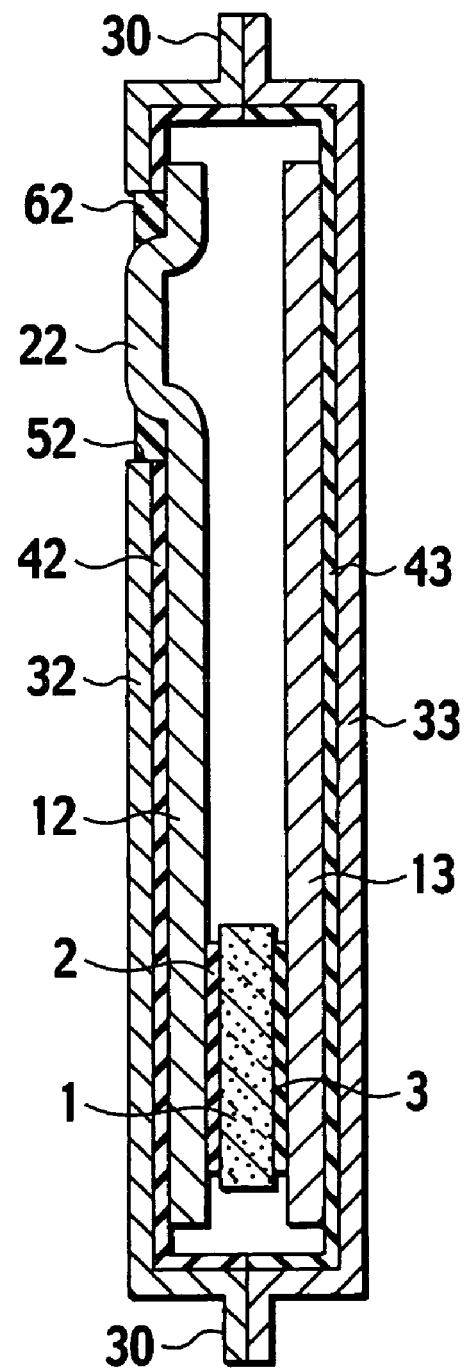
FIG. 6 is a sectional view showing a semiconductor package according to a second embodiment of the present invention.
Figure 7:
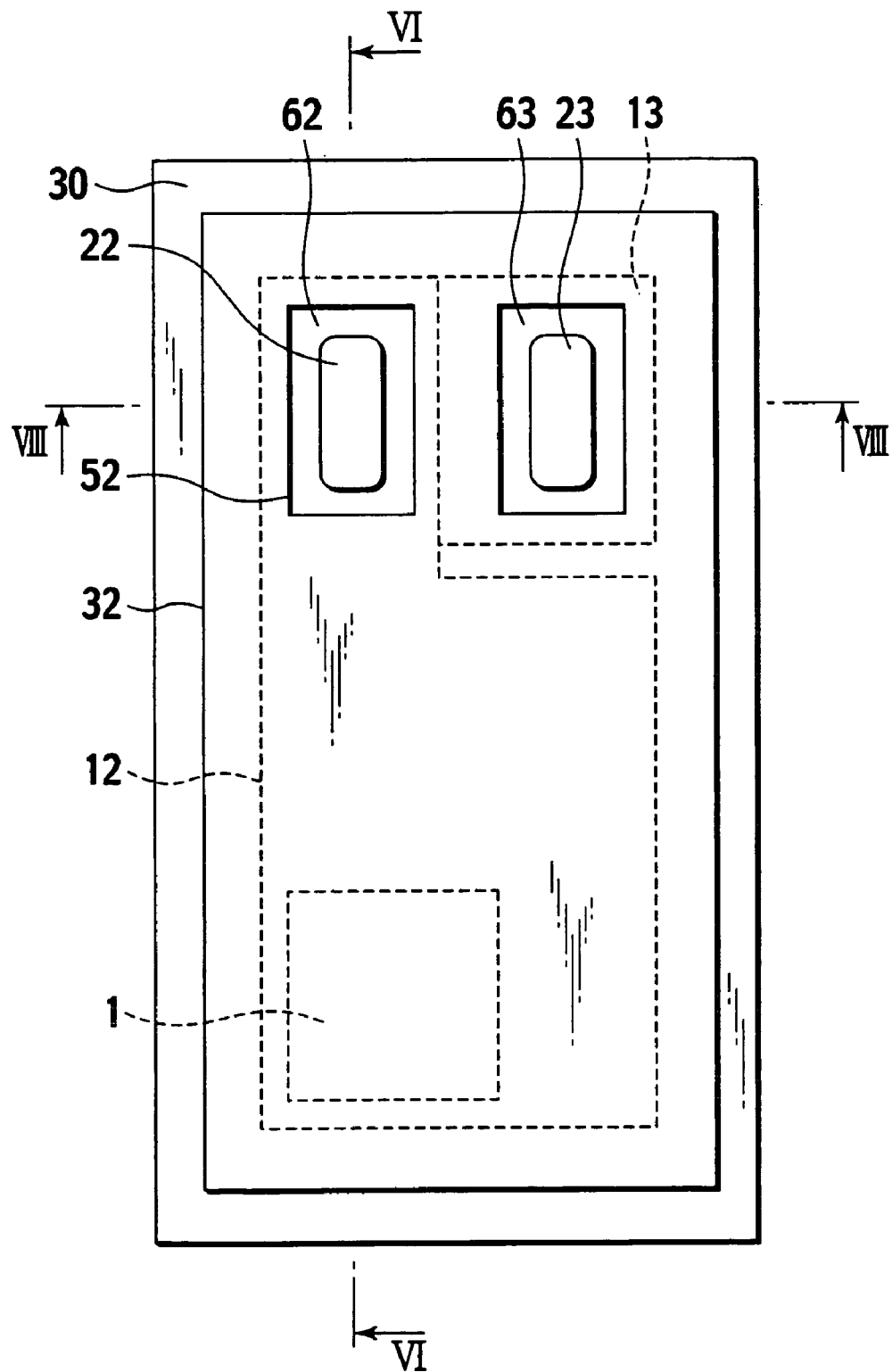
FIG. 7 is a plan view showing the semiconductor package of FIG. 6.
Figure 8:
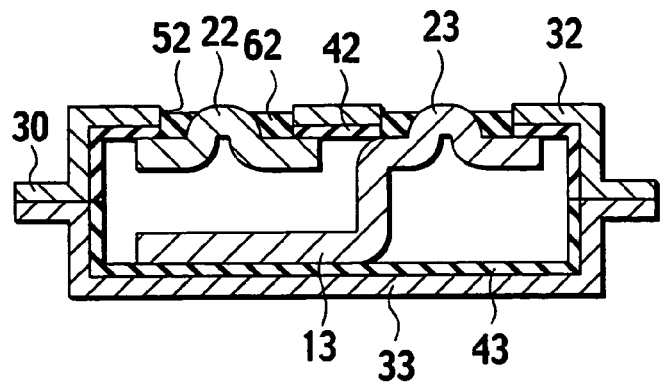
FIG. 8 is a sectional view taken along a line VI-VI of FIG. 7.

According to the first embodiment of FIG. 1, the first and second external connection terminals 22 and 23 are exposed from opposite sides of the semiconductor package. According to a second embodiment of the present invention, the first and second external connection terminals 22 and 23 are exposed from one side of the semiconductor package as shown in FIG. 6. FIG. 7 is a top plan view showing the semiconductor package of the second embodiment. A line VI-VI of FIG. 7 provides the sectional view of FIG. 6. FIG. 8 is a sectional view taken along a line VIII-VIII of FIG. 7.

Figure 9:
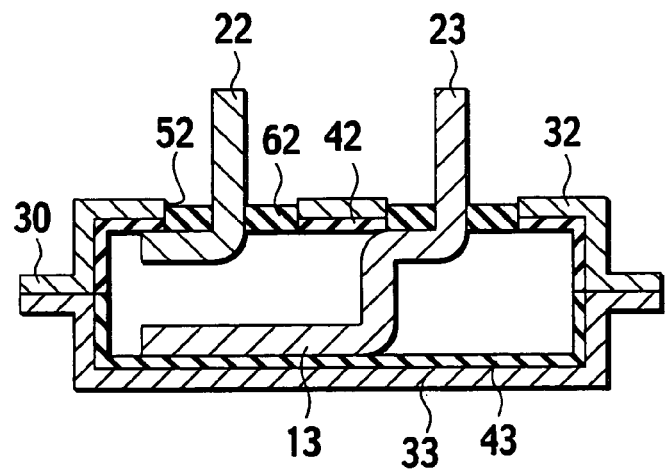
FIG. 9 is a sectional view taken along the line VI-VI of FIG. 7, showing a first modification of the semiconductor package of FIG. 6.

FIG. 9 shows a first modification of the second embodiment that outwardly protrudes the first and second external connection terminals 22 and 23.

Figure 10:
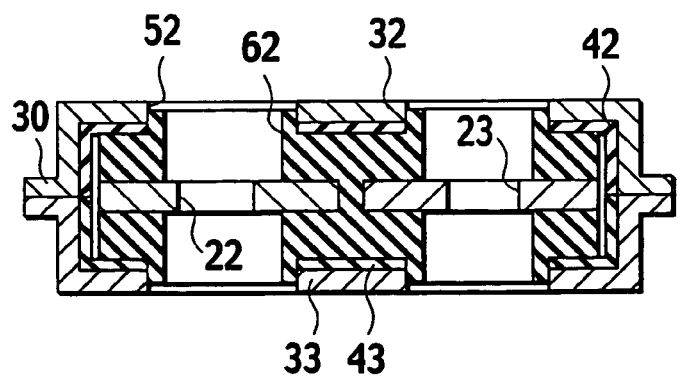
FIG. 10 is a sectional view taken along the line VI-VI of FIG. 7, showing a second modification of the semiconductor package of FIG. 6.
Figure 11:
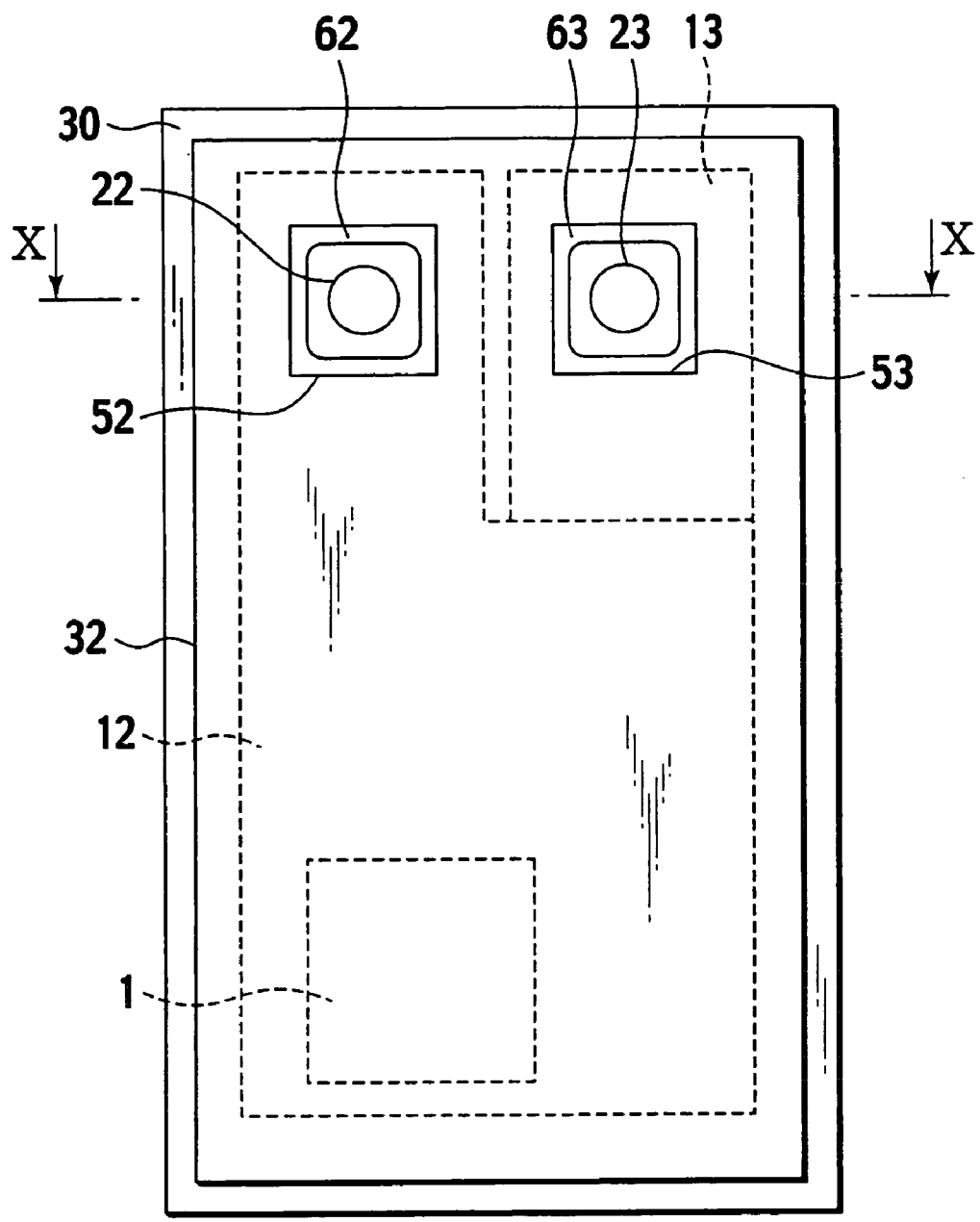
FIG. 11 is a plan view showing the semiconductor package of FIG. 10.

FIGS. 10 and 11 show a second modification of the second embodiment that provides the first and second external connection terminals 22 and 23 with connection through holes. These holes are formed through the package. FIG. 11 is a top plan view showing the semiconductor package of FIG. 10, and a line X-X of FIG. 11 provides the sectional view of FIG. 10.

Third Embodiment

According to the first embodiment of FIG. 1, the first and second external connection terminals 22 and 23 are exposed from the holes 52 and 53 formed in the first and second shells 32 and 33. According to a third embodiment of the present invention shown in FIG. 12, the first and second external connection terminals 22 and 23 are extended outside through a part of the joint of the peripheries 30 of the first and second shells 32 and 33. In this case, an insulating film 40 is interposed between the terminals 22 and 23. Even with this configuration, airtightness of the inside of the package is maintained by properly jointing the first and second shells 32 and 33 together.

Figure 12:
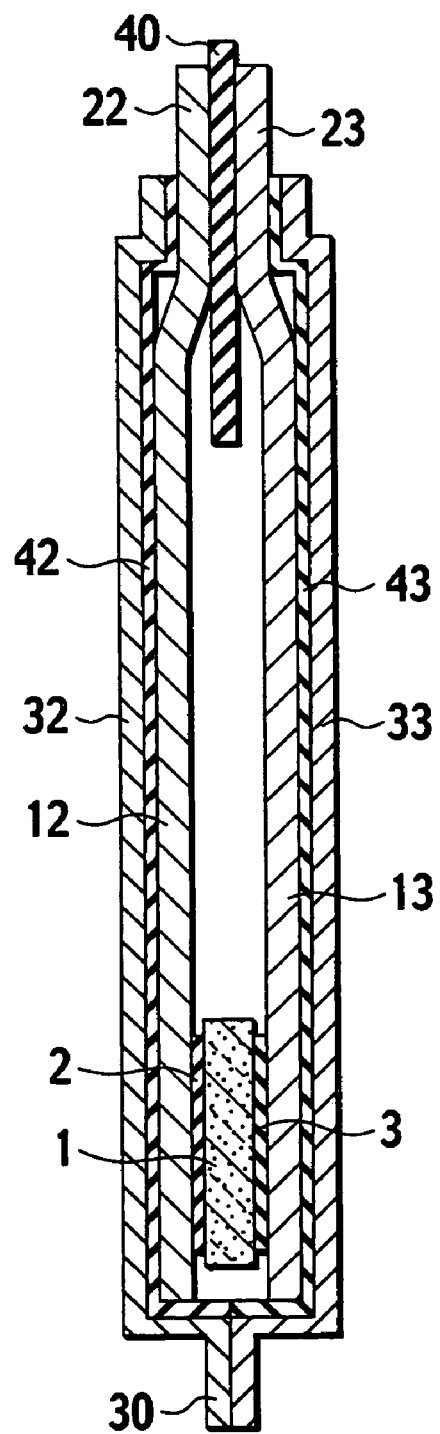
FIG. 12 is a sectional view showing a semiconductor package according to a third embodiment of the present invention.

The configuration of FIG. 12 may be preferable for some external apparatus (not shown) used with the semiconductor package.

According to the embodiments and modifications mentioned above, the semiconductor package contains a single semiconductor chip. Instead, the package may contain a plurality of semiconductor chips. The semiconductor chip 1 is not limited to a diode chip. It may be, for example, a transistor chip having a pair of main electrodes and a control electrode.

The cooling units (8, 70) shown in FIGS. 4 and 5 for cooling the first and second shells 32 and 33 are also applicable to the semiconductor packages shown in FIGS. 6 to 12.

The entire content of a Patent Application No. TOKUGAN 2004-221706 with a filing date of Jul. 29, 2004 in Japan is hereby incorporated by reference.

Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A semiconductor package comprising:
a semiconductor chip having first and second main electrodes arranged on two principal surfaces of the semiconductor chip, respectively, the two principal surfaces being opposite to each other;
a first main wiring plate connected to the first main electrode and having a first external connection terminal whose location is separated from a location where the first main wiring plate is connected to the first main electrode;
a second main wiring plate connected to the second main electrode and having a second external connection terminal whose location is separated from a location where the second main wiring plate is connected to the second main electrode;
a first shell connected through an insulating film to at least a part of a second principal surface of the first main wiring plate, the second principal surface of the first main wiring plate being opposite to a first principal surface of the first main wiring plate that is connected to the first electrode; and
a second shell connected through an insulating film to at least a part of a second principal surface of the second main wiring plate, the second principal surface of the second main wiring plate being opposite to a first principal surface of the second main wiring plate being opposite to a first principal surface of the second main wiring plate that is connected to the second electrode, wherein:
the first and second main wiring plates are arranged so that the first principal surfaces are adjacent to and parallel to each other, the first and second external connection terminals are arranged outside of the location where the first principal surfaces are adjacent to and parallel to each other, and the first and second main wiring plates and the first and second external connection terminals are arranged so that the first and second main wiring plates and the first and second external connection terminals are plane symmetrical about an axis parallel to the principal surfaces of the semiconductor chip.

2. The semiconductor package of claim 1 wherein:
the first external connection terminal is exposed from a first hole formed in a part of the first shell, and the second external connection terminal is exposed from a second hole formed in a part of the second shell.

3. The semiconductor package of claim 2, further comprising:
insulating material filled in a gap between the first hole and the first external connection terminal and a gap between the second hole and the second external connection terminal.

4. The semiconductor package of claim 1, wherein:
the first and second external connection terminals are exposed to the outside through a gap formed between the first shell and the second shell.

5. The semiconductor package of claim 3, wherein the periphery of the first shell is entirely connected to the periphery of the second shell, to keep the inside of the first and second shells airtight.

6. The semiconductor package of claim 5, wherein:
an inner pressure of the space enclosed in the first and second shells is set to be $3.4 \times 10^4$ Pa or lower at 0° C.

7. The semiconductor package of claim 1, further comprising:
a heat radiation fin connected to a principal surface of the first or second shell opposite to the semiconductor chip.

8. The semiconductor package of claim 7, wherein:
the heat radiation fin is connected only above the semiconductor chip and near the first and second external connection terminals.

9. The semiconductor package of claim 1, wherein:
the semiconductor chip is flexible, and the first and second main wiring plates and first and second shells are made of flexible material.

* * * * *